(12) United States Patent
Karppinen et al.

(10) Patent No.: US 7,176,674 B2
(45) Date of Patent: Feb. 13, 2007

(54) MEASUREMENT OF ENERGY BY MEANS OF A FREQUENCY CONVERTER

(75) Inventors: Veijo Karppinen, Vaasa (FI); Risto Komulainen, Klaukkala (FI)

(73) Assignee: Vacon OYJ, Vaasa (FI)

( * ) Notice: Subject to any disclaimer, the term of this patent is extended or adjusted under 35 U.S.C. 154(b) by 0 days.

(21) Appl. No.: 10/941,975

(22) Filed: Sep. 16, 2004

(65) Prior Publication Data

US 2005/0083035 A1 Apr. 21, 2005

(30) Foreign Application Priority Data

Sep. 19, 2003 (FI) .................................. 20031349

(51) Int. Cl.
*G01R 11/00* (2006.01)
*G01R 31/00* (2006.01)
(52) U.S. Cl. .................... 324/142; 324/772; 324/158.1
(58) Field of Classification Search ...................... None
See application file for complete search history.

(56) References Cited

U.S. PATENT DOCUMENTS 4,088,932 A 5/1978 Okuyama et al.
4,263,542 A * 4/1981 Schulze et al. ............. 318/803
4,723,104 A * 2/1988 Rohatyn ..................... 318/813
4,795,974 A * 1/1989 Landman et al. ........... 324/142
4,907,144 A * 3/1990 Tuusa .......................... 363/37
5,471,125 A * 11/1995 Wu ............................. 318/803
5,673,732 A 10/1997 Kenney et al.
5,925,998 A * 7/1999 Olson ......................... 318/484
6,354,805 B1 3/2002 Møoller
6,911,793 B2 * 6/2005 Fritsch et al. ............... 318/268
2005/0018459 A1 * 1/2005 Miettinen ................... 363/136

FOREIGN PATENT DOCUMENTS

DE 35 40 127 A1 6/1986
EP 0 584 713 A1 3/1994
GB 2 281 825 A 3/1995

* cited by examiner

*Primary Examiner*—Paresh Patel
(74) *Attorney, Agent, or Firm*—Birch, Stewart, Kolasch & Birch, LLP

(57) ABSTRACT

A method and system for the measurement of energy in an alternating-current motor drive containing a frequency converter or an equivalent stepless rotational speed regulator provided with semiconductor switches. In this regulator, the power taken by the motor drive from the mains is determined, and based on the power taken by the motor drive from the mains, the energy taken from the supply mains, especially the accumulated energy consumption after a given instant is determined.

6 Claims, 1 Drawing Sheet

MEASUREMENT OF ENERGY BY MEANS OF A FREQUENCY CONVERTER

This Nonprovisional application claims priority under 35 U.S.C. § 119(a) on Patent Application No(s). 20031349 filed in Finland on Sep. 19, 2003, the entire contents of which are hereby incorporated by reference.

BACKGROUND OF THE INVENTION

Field of the Invention

The present invention relates to a method and system for the measurement of energy in an alternating-current motor drive containing a frequency converter or an equivalent stepless device for rotational speed regulation provided with semiconductor switches.

DISCUSSION OF THE BACKGROUND

As is known, using an electric drive provided with rotational speed regulation it is possible to save a considerable amount of energy as compared to the traditional constant-speed motor drive, where the required regulation of the process is implemented by throttling with a valve or by applying the On/Off principle. Such processes include e.g. control of surface level or pressure.

Figure 1:
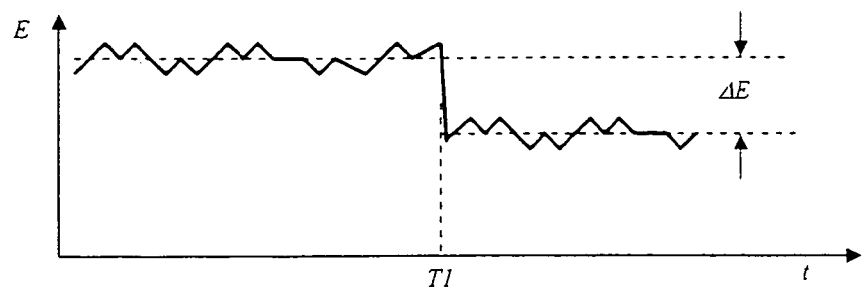

The extent of energy savings can be estimated in one of the following well-known ways:

1. By verifying afterwards from the electricity bill how much lower the energy consumption has been ($\Delta E$) after the installation of rotational speed regulation (T1) as compared to earlier history data (FIG. 1).

2. Mathematically by estimating on the basis of process data the required power before and after installation of rotational speed regulation, by taking into account the dissipation power of the motor and frequency converter and calculating the size of the electricity bill from the consumption indications thus obtained.

Often there are several energy consuming installations connected to the same energy meter, external factors such as loading conditions do not necessarily remain the same etc., so an energy saving estimation thus obtained may be very inaccurate.

Figure 2:
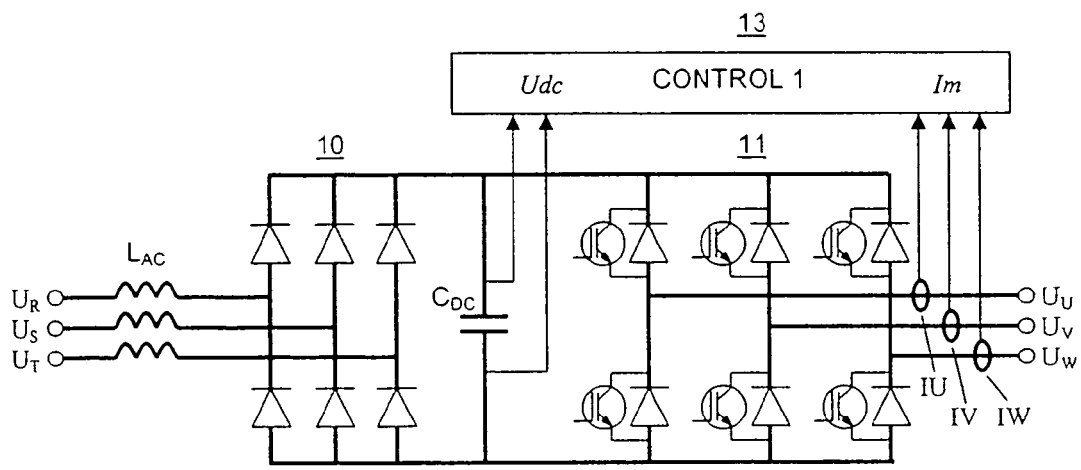

Many frequency converters have an integrated power measuring system that indicates the power supplied to the motor and, on the basis of this, also the accumulated energy consumption. The measurement is normally based on a measurement of motor current (Im) and intermediate circuit voltage (Udc) as illustrated in FIG. 2. Based on these signals, the control unit of the frequency converter is able to calculate the output voltage (Um) as well as the magnitude of the phase shift angle ($\phi_m$) between voltage and current. On the basis of these data, it is possible to calculate the power supplied to the motor $$Pm = \sqrt{3} \times Um \times Im \times \cos \phi m \quad (1)$$

and further the energy consumption as the time integral of power $$Em = \int Pm \times dt \quad (2)$$

whereas the power and energy taken from the supply mains, for which the client actually pays to the electricity company, are not measured by prior-art frequency converters.

SUMMARY OF THE INVENTION

The object of the present invention is to create a motor drive which is implemented using a frequency converter or equivalent and wherein the power and energy taken from the supply mains by the electric drive in question are also measured. This is achieved by providing the frequency converter with an integrated system of measuring the power and energy taken from the supply mains. In this way, the advantage achieved by using a regulated electric drive can be measured directly without any error caused by external ambiguity factors. When the frequency converter is additionally provided with means allowing data storing and processing actions to be performed e.g. by using an application-specific program, it will be possible to display momentary and accumulated savings e.g. on the frequency converter's display panel both as an energy indication and in terms of money when the price of energy is known.

The measurement indicates at least the instantaneous value of the power taken from the supply mains the consumption of energy taken from the supply mains since a given instant of time the amount of energy saved as compared to a given reference (direct unregulated motor drive).

The energy meter of the invention, which is integrated in a frequency converter or equivalent rotational speed regulation device, can be utilized in many new electric drive and business concepts.

The details of the features of the method of the invention and the system applying it are disclosed in the claims to follow.

BRIEF DESCRIPTIONS OF THE DRAWINGS

Figure 3:
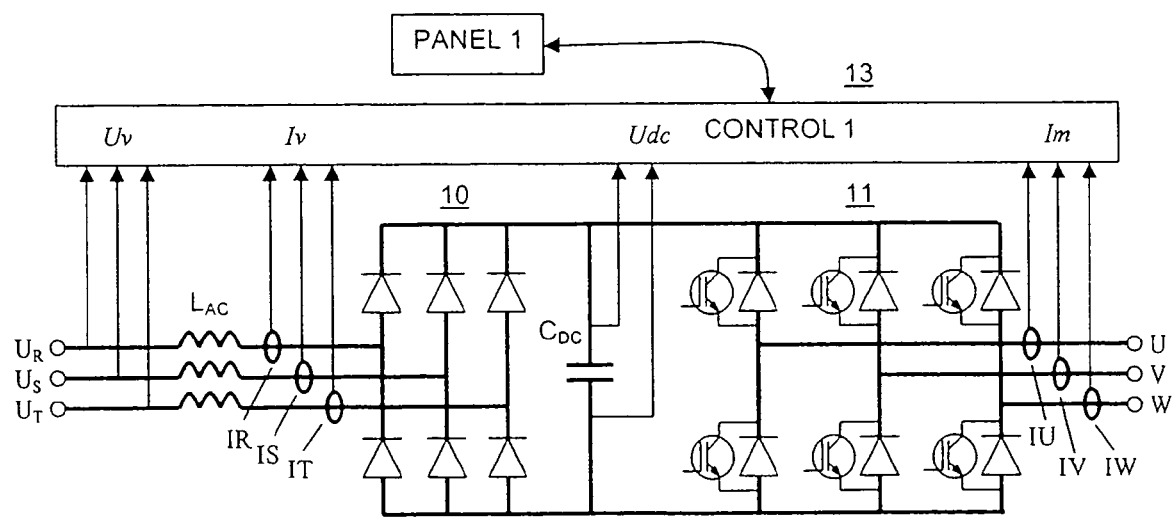

In the following, the invention will be described in detail with reference to an example and the attached drawings, wherein FIG. 1 represents energy consumption as a function of time after the introduction of rotational speed regulation, as compared to earlier history data, FIG. 2 represents prior-art measurement of power in a frequency converter, and FIG. 3 represents energy measurement according to the invention.

DETAILED DESCRIPTION OF THE PREFERRED EMBODIMENTS

FIG. 2 presents a prior-art three-phase voltage-controlled PWM frequency converter, which comprises a mains bridge (rectifier) 10 for rectifying the three-phase alternating mains voltage consisting of phase voltages $U_R$, $U_S$, $U_T$ to produce an intermediate-circuit direct voltage $U_{DC}$ and a load bridge (inverter) 11 for inverting the intermediate-circuit direct voltage to produce a variable-frequency three-phase alternating voltage consisting of phase voltages $U_U$, $U_V$, $U_W$. The frequency converter may feed e.g. a three-phase cage induction motor. The load bridge 11 is a full-wave bridge in which a control unit 13 controls the phase switches of each phase by pulse-width modulation. The mains bridge 10 may be e.g. an uncontrolled full-wave bridge as presented in the figure. According to prior art, the direct-voltage intermediate circuit is provided with a capacitor $C_{DC}$ for filtering the direct voltage, and an inductor $L_{AC}$ at the input connections for filtering the mains current. The frequency converter is controlled by a control unit CONTROL1.

The frequency converter in FIG. 2 comprises integrated means as described above for the measurement of output current and intermediate circuit voltage. On the basis of the results measured by the aforesaid means, it is possible to determine the power supplied to the motor and, based on this, also the accumulated energy consumption from equations (1) and (2). The output current Im can be measured e.g. as shown in the figure by means of current transformers IU, IV and IW, and the intermediate circuit voltage $U_{DC}$ can be measured by measuring circuits contained in the control unit CONTROL1.

In the example presented in FIG. 3, as a solution according to the invention, the frequency converter additionally comprises integrated means for measuring the voltage Uv of the supply mains and the current Iv taken from the supply mains, on the basis of which it is possible to determine the power taken from the supply mains and further, from equation (3), the energy consumption. The current Iv of the supply mains can be measured e.g. as shown in the figure by means of current transformers IR, IS and IT and the mains voltage by means of measuring circuits provided in the control unit. The power Pv can be calculated directly according to equation 3, where φv is the phase shift angle between the mains voltage and current.

$$Pv = \sqrt{3} \times Uv \times Iv \times \cos \phi v \quad (3)$$

The measurement of supply power can also be implemented on the basis of measured motor power by performing a series of calibration measurements with different loads, measuring the ratio k between the motor power Pm indicated by the frequency converter and the power Pv taken from the mains as measured by external measuring devices, which ratio is then programmed for use as a correction factor in the application program memory of the frequency converter. In this way, the frequency converter can calculate in real time the instantaneous value of the power Pv taken from the mains and therefore also the accumulated value of energy taken from the mains.

$$Pv = k \times Pm \quad (4)$$

In the control unit of the frequency converter, data storage and processing operations are additionally performed using e.g. an application-specific program. Thus it will be possible to display momentary and accumulated savings e.g. on the display panel PANEL1 of the control unit of the frequency converter both as an energy indication and in terms of money, the price of energy being known.

For example, in a pumping process, where the delivery is traditionally regulated by means of a throttle valve, the following procedure can be observed:

1. The power taken from the mains by a motor provided with direct mains supply is measured at different delivery points of the process when the delivery is regulated by means of a throttle valve. The measurement may be performed using either a separate power meter or a frequency converter according to the invention when the output frequency has been set to be the same as the frequency (50 or 60 Hz) of the supply mains.
2. The throttle valve is removed or set to a completely open position, and the power consumption is measured at the same delivery points with the motor working under rotational speed control.
3. The consumption indication from measurement 1 is set as a reference to which the frequency converter continuously compares the indications given by the internal measurement during the process and, based on the difference, calculates the accumulated energy saving. Based on this reading, the frequency converter can also calculated the saving directly in terms of money.

It is obvious to the person skilled in the art that different embodiments of the invention are not limited to the example described above, but that they may be varied within the scope of the claims presented below.

The invention claimed is:

1. A method for the measurement of energy in an alternating-current motor drive containing a frequency converter provided with semiconductor switches,
   comprising the steps of:
   determining in the frequency converter, the power taken by the motor drive from the mains,
   determining the energy taken from the supply mains, based on the power taken by the motor drive from the mains, especially the accumulated energy consumption after a given instant; and
   wherein in the power taken from the mains is determined on the basis of measured load power.

2. A method according to claim 1, further comprising:
   determining the power taken from the supply mains on the basis of measured load power by performing a series of calibration measurements with different loads, measuring the ratio (k) between the power (Pv) taken from the mains as measured by external measuring devices and the load power (Pm) indicated by the regulator, which ratio (k) is then specified as a correction factor the power taken from the supply mains being thus $$Pv = k \times Pm. \quad (4)$$

3. A method according to claim 1 or 2,
   wherein the energy measurement determines the consumption difference as compared to a reference situation, e.g. a situation where the rotational speed of an electric motor is not regulated.

4. A method according to claim 1 or 2,
   wherein, to measure energy savings, the motor drive fed by a frequency converter is at first operated at constant speed to measure a reference consumption, and
   next the motor drive is operated under rotational speed regulation, with its internal energy measurement calculating the consumption difference directly as compared to constant-speed regulation.

5. A system for the measurement of energy in an alternating-current motor drive comprising:
   a frequency converter provided with semiconductor switches and a control unit,
   the control unit measuring the power taken by the motor drive from the mains,
   the control unit determining the energy taken from the supply mains, based on the power taken by the motor drive from the mains, especially the accumulated energy consumption after a given instant; and
   wherein the power taken from the mains is determined on basis of measured load power.

6. A system according to claim 5, further comprising:
   output current and voltage measuring elements (IU, IV, IW) for the measurement of load power taken by the motor drive,
   wherein the control unit determines the power taken from the supply mains on the basis of a series of calibration measurements performed with different loads, in which measurement series the ratio (k) between the power (Pv) taken from the mains as measured by external measuring devices and the load power (Pm) indicated by the regulator, which ratio (k) is specified as a correction factor, the power taken from the supply mains being $$Pv = k \times Pm. \quad (4)$$

* * * * *